United States Patent [19]

Wataze et al.

[11] Patent Number: 5,021,844
[45] Date of Patent: Jun. 4, 1991

[54] SEMICONDUCTOR DEVICE

[75] Inventors: Manabu Wataze; Takao Sakayori, both of Itami, Japan

[73] Assignee: Mitsubishi Denki Kabushiki Kaisha, Tokyo, Japan

[21] Appl. No.: 533,942

[22] Filed: Jun. 6, 1990

Related U.S. Application Data

[63] Continuation of Ser. No. 378,703, Jul. 11, 1989, abandoned.

[30] Foreign Application Priority Data

Jul. 18, 1988 [JP] Japan ................................ 63-179713

[51] Int. Cl.$^5$ ...................... H01L 29/10; H01L 23/48
[52] U.S. Cl. ................................. 357/23.3; 357/23.4; 357/65; 357/68
[58] Field of Search ....................... 357/23.4, 23.3, 65, 357/68

[56] References Cited

FOREIGN PATENT DOCUMENTS 63-090174  4/1988  Japan .

Primary Examiner—Michael C. Wimer
Assistant Examiner—Wael Fahmy
Attorney, Agent, or Firm—Leydig, Voit & Mayer

[57] ABSTRACT

A semiconductor device includes two leads spaced apart from each other on a semiconductor substrate, a plurality of first electrodes opposite the leads, a second electrode having a pad portion located between the two leads, and a linear portion between the first and second electrodes, connecting portions, each for connecting one of the first electrodes with one of the leads via an electrically insulating cross-opver, the connecting portions adjacent the pad portion being diagonal to the linear portion of the second electrode. Thus, the width of the first electrode opposite the pad portion is reduced without modifying the other pattern elements. As a result, integration density can be improved.

7 Claims, 2 Drawing Sheets

SEMICONDUCTOR DEVICE

This application is a continuation of Application Ser. No. 07/378,703, filed July 11, 1989, now Abandoned.

FIELD OF THE INVENTION

The present invention relates to a semiconductor device, and, more particularly, to a semiconductor device in which electrodes are connected by cross-over or air bridge interconnections.

BACKGROUND OF THE INVENTION

In a semiconductor device in which electrodes are interconnected by cross-overs or air bridges, the configuration of the electrode connecting region usually influences the chip (cell) size. FIG. 2 shows schematically the structure of a prior art GaAs MESFET.

In FIG. 2, reference numeral 1 designates one of two depicted source electrode leads that are spaced apart from each other and disposed on the main surface of semiconductor substrate 6. A plurality of source electrodes 2 are disposed on substrate 6 spaced from each other by the channel regions of the MESFET. A gate electrode 7 having a pad portion 5 located between the source leads 1 and a linear portion 8 generally perpendicular to source electrodes 2 is disposed on the substrate 6. Reference numeral 4 designates a drain electrode having drain fingers 4a which are located generally parallel to the source electrodes 2 on the same surface of the substrate 6. One of the drain fingers 4a is arranged opposite the pad portion 5 of the gate electrode 7. A gate element portion 5a which is electrically connected with a linear portion of the gate electrode 7 is disposed on the channel between the source electrode 2 and the drain finger 4a.

Herein, each source electrode 2 is connected with a source lead electrode 1 by an electrically insulating cross-over such as air bridge. In this example a connection portion 3 between each of the source electrodes 2 and one of the source leads 1 is produced along the shortest straight line between them.

In the device of FIG. 2, the relationships between the widths, lengths and distances between the respective electrodes 2, 4, 4a, 5 and 5a are determined for efficiency and reliability. In the described structure, the width of the drain finger 4a confronting the electrode pad 5 of the gate electrode 7 is unavoidably wider than that of the other drain fingers 4a.

In the prior art electrode arrangement, the width of the drain finger 4a confronting the electrode pad 5 of the gate electrode 7 reduces the integration density where a plurality of cells, i.e., MESFETS, are included in a chip, such as in a high power output element, increasing. The increased chip size in turn results in a reduction in gain due to phase shifting of a high frequency signal.

SUMMARY OF THE INVENTION

It is an object of the present invention to provide a semiconductor device capable of improving the pattern integration density.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, connecting electrode portions are produced in a diagonal direction for connecting first electrodes at both sides of the pad portion of a second electrode with respective end portions of first electrode leads. The angle of inclination of the connecting portion which is closer to the end portion of the electrode lead is wider relative to the central portion thereof. Accordingly, it is possible to reduce the width of the finger electrode confronting the electrode pad of the second electrode to the extent of the inclination of the connection portion, thereby enhancing the degree of integration.

DETAILED DESCRIPTION OF THE PREFERRED EMBODIMENTS

An embodiment of the present invention will be described in detail with reference to the drawings.

Figure 1:
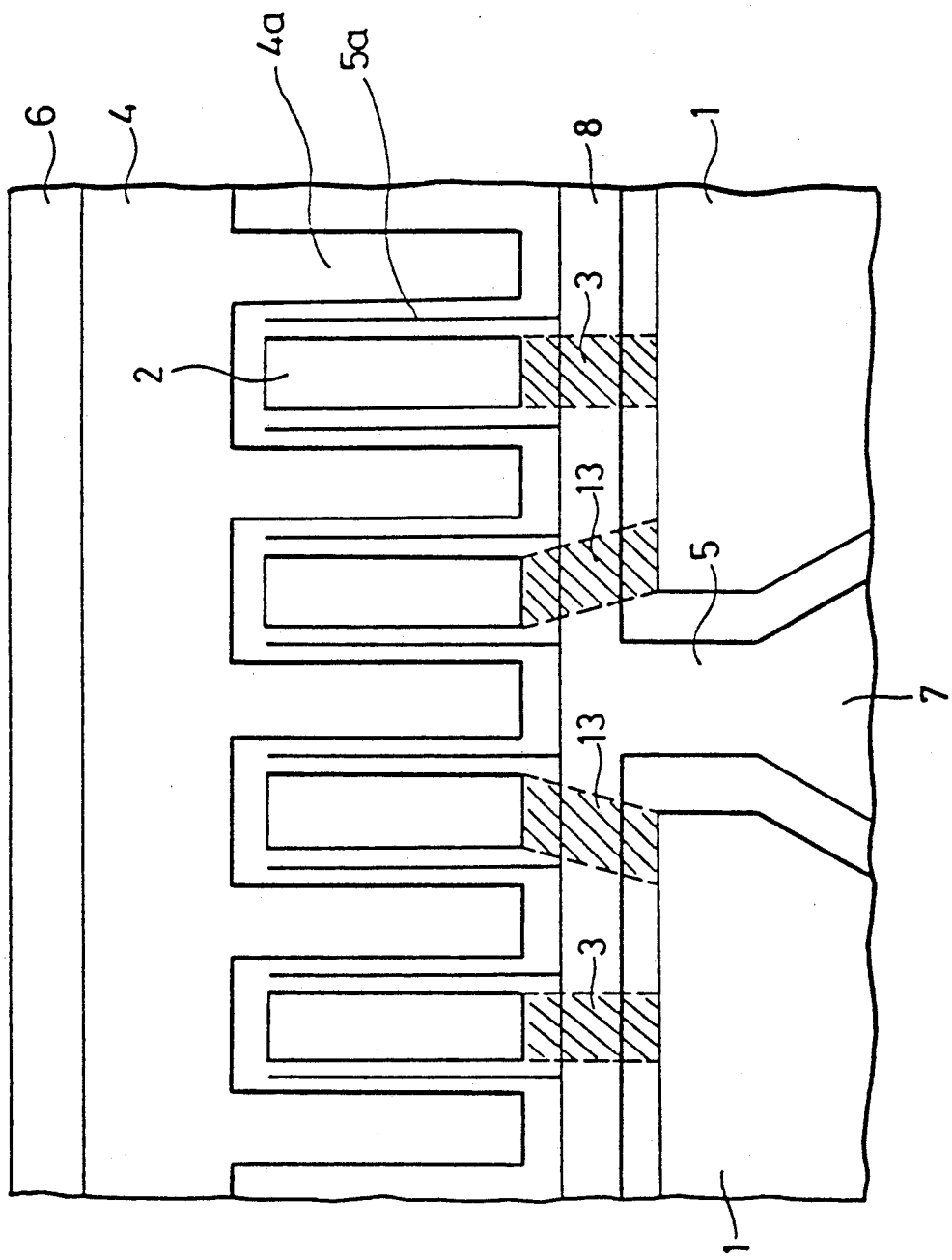
FIG. 1 is a plan view showing schematically the structure of a semiconductor device according to an embodiment of the present invention.
Figure 2:
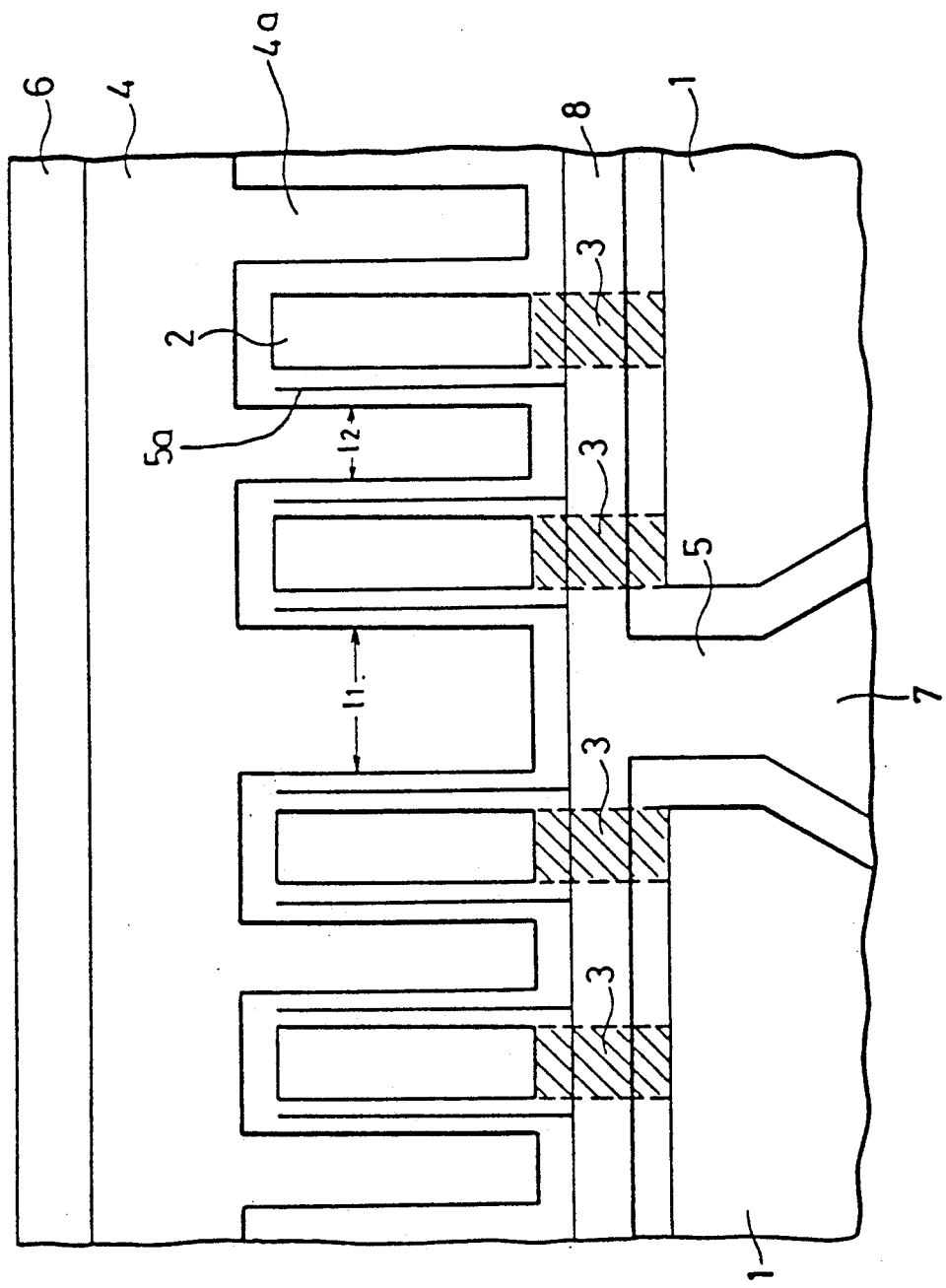
FIG. 2 is a plan view showing schematically the structure of a prior art semiconductor device.

FIG. 1 shows schematically the structure of a semiconductor device according to an embodiment of the present invention. In FIG. 1, the same reference numerals designate the same or corresponding elements shown in FIG. 2.

In the structure of FIG. 1, connection portions 3 remote from pad portion 5 of gate electrode 7 follow straight lines, i.e., are substantially perpendicular to the linear portion 8 of gate electrode 7. The connecting portions 13 adjacent pad portion 5 of gate electrode 7 are, however, diagonal, i.e., inclined and not perpendicular, to the linear portion 8 of the gate electrode 7. The connection portions 13 connect the respective source electrodes 2 to the respective source leads 1. The drain finger 4a located between connection portions 13 confronts the pad portion 5 of the gate electrode 7. The linear portion 8 of the gate electrode 7 is disposed between the source electrodes 2 and the source leads 1 as in the structure of FIG. 2.

Since the connecting portions 13 are diagonal rather than perpendicular to linear gate portion 8, as are the connecting portions 3, the width of the drain finger 4a confronting to the electrode pad 5 of the gate electrode 7 is reduced, without increasing the size of the other pattern elements of the prior art, thereby improving integration density.

While in the above illustrated embodiment a field effect transistor is described, the present invention may also be applied to other element structures.

As discussed above, according to the present invention, connecting electrode portions are produced in a diagonal direction in order to connect first electrodes at both sides of the pad portion of a second electrode with respective end portions of first electrode leads. The width of the finger electrode confronting to the electrode pad is reduced without modifying the other pattern elements, improving integration density.

What is claimed is:

1. A semiconductor device comprising:
   a semiconductor substrate;

first and second spaced apart leads disposed on said substrate for providing electrical connections to first electrodes;

a plurality of generally parallel, uniformly spaced first electrodes disposed on said substrate opposite and respectively electrically connected to one of said first and second leads;

a second electrode disposed on said substrate and including a pad portion disposed between said first and second leads and a linear portion disposed between said first electrodes and said first and second leads transverse to said first electrodes; and connecting portions, each having the shape of a parallelogram and electrically connecting one of said first electrodes to one of said first and second leads, crossing and electrically insulated from the liner portion of said second electrode wherein each of said connecting portions adjacent said pad portion has the shape of a non-rectangular parallelogram and each of said connecting portions not adjacent said pad portion is rectangular.

2. The semiconductor device as defined in claim 1 wherein said device is a field effect transistor, said first electrodes are source electrodes, and said second electrode is a gate electrode.

3. The semiconductor device as defined in claim 2 including a drain electrode disposed on said substrate and including a plurality of drain fingers wherein one of said drain fingers is located opposite said pad portion.

4. The semiconductor device of claim 1 wherein said first electrodes have substantially uniform widths, each of said connecting portions has an edge connected to a first electrode of substantially the same dimension as the width of the respective first electrode, and each of said connecting portions has substantially the same area whereby each connecting portion produces substantially the same phase shift of an electrical signal flowing through it.

5. The semiconductor device of claim 1 wherein said first electrodes are of generally uniform width and said first electrodes electrically connected to said first lead are disposed on said substrate extending over a predetermined length, said first lead having a front edge opposite said first electrodes to which it is electrically connected that is shorter than said predetermined length by at least the width of one of said first electrodes.

6. A semiconductor device comprising:

a semiconductor substrate;

first and second spaced apart leads disposed on said substrate for providing electrical connections to first electrodes;

a plurality of generally parallel, uniformly spaced first electrodes of generally uniform width disposed on said substrate and respectively electrically connected to one of said first and second leads;

a second electrode disposed on said substrate and including a pad portion disposed between said first and second leads and a linear portion disposed between said first electrodes and said first and second leads transverse to said first electrodes; and connecting portions, each having the shape of a parallelogram and electrically connecting one of said first electrodes to one of said first and second leads, crossing and electrically insulated from the linear portion of said second electrode wherein each of said connecting portions adjacent said pad portion has the shape of a non-rectangular parallelogram and each of said connection portions not adjacent said pad portion is rectangular, said first electrodes electrically connected to said first lead extend over a predetermined length on the substrate, said first lead has a front end opposite said first electrodes to which it is electrically connected that is shorter than said predetermined length by at least a width of one of said first electrodes.

7. The semiconductor device of claim 6 wherein said first electrodes have substantially uniform widths, each of said connecting portions has an edge connected to a first electrode of substantially the same dimension as the width of the respective first electrode, and each of said connecting portions has substantially the same area whereby each connecting portion produces substantially the same phase shift of an electrical signal flowing through it.

* * * * *